United States Patent
Hokenmaier et al.

(10) Patent No.: US 7,333,382 B2
(45) Date of Patent: Feb. 19, 2008

(54) METHOD AND APPARATUS FOR AN OSCILLATOR WITHIN A MEMORY DEVICE

(75) Inventors: Wolfgang Hokenmaier, Burlington, VT (US); Helmut Seitz, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/354,985

(22) Filed: Feb. 16, 2006

(65) Prior Publication Data

US 2007/0189095 A1    Aug. 16, 2007

(51) Int. Cl.
*G11C 7/00*    (2006.01)
(52) U.S. Cl. ............. 365/222; 365/185.15; 365/185.26
(58) Field of Classification Search .................. 365/222, 365/185.25, 185.15, 189.26
See application file for complete search history.

(56) References Cited

U.S. PATENT DOCUMENTS

| | | | |
|---|---|---|---|
| 5,446,695 A | 8/1995 | Douse et al. | |
| 5,596,545 A | 1/1997 | Lin | |
| 5,862,094 A * | 1/1999 | Kawabata et al. | 365/222 |
| 5,991,214 A | 11/1999 | Merritt et al. | |
| 6,087,820 A | 7/2000 | Houghton et al. | |
| 6,154,408 A | 11/2000 | Yuh | |
| 2005/0125597 A1 | 6/2005 | Lovett | |
| 2005/0265105 A1 | 12/2005 | Lee | |
| 2006/0145667 A1* | 7/2006 | Matsui et al. | 320/150 |

* cited by examiner

*Primary Examiner*—Pho M. Luu
(74) *Attorney, Agent, or Firm*—Edell, Shapiro & Finnan LLC

(57) ABSTRACT

An apparatus for controlling generation of pulses for refresh operations of a memory device having a pad to transfer information and to receive signals from an external interface. The apparatus includes a switch, coupled to a current source and to the pad receiving signals from the external interface. The switch outputs one of the signals from the current source or the pad in response to a switch control signal. An oscillator is coupled to the switch and generates the refresh operation pulses in response to the output from the switch.

9 Claims, 3 Drawing Sheets

METHOD AND APPARATUS FOR AN OSCILLATOR WITHIN A MEMORY DEVICE

BACKGROUND OF THE INVENTION

1. Technical Field

The present invention pertains to memory devices. In particular, the present invention pertains to externally controlling a self-refresh oscillator within a memory device during a test mode to enable measurement of various memory operating characteristics.

2. Discussion of the Related Art

Memory devices are utilized to store information for various applications. A commonly utilized memory device includes a dynamic random access memory (DRAM). These types of memory devices store information in memory cell arrays that are configured in a matrix of intersecting rows and columns. The rows are commonly referred to as word lines. Each memory cell generally includes a storage capacitor to hold a charge and a transistor to access the charge of the capacitor. The charge may be a high or low voltage potential (referred to as a data bit), thereby providing the memory cell with two logic states.

The memory cells of the DRAM must be refreshed periodically due to leakages within the capacitors storing the charges (or bits). The refresh operation may be performed either by a memory controller issuing an auto-refresh (or "CBR") command, or by the memory in a self-refresh mode. During the self-refresh mode, a self-refresh pulse generator or oscillator within a memory self-refresh unit generates self-refresh pulses to enable each memory cell to be refreshed according to a desired specification. Further, the memory includes a power or generator system to generate appropriate internal voltages for memory operation. For low power memory designs (e.g., CellularRAMs, MobileRAMs, etc.), a portion of the power or generator system is clocked to permit that system to be enabled a certain percentage (e.g., 10%, etc.) of the time during a self-refresh mode in order to conserve current. The clocked standby mode (e.g., mode or time interval in which the generator system is idle) for the generator system is controlled by control signals or pulses received from the self-refresh unit based on the generated self-refresh pulses.

For test purposes, full control over generation of the self-refresh pulses and the clocked standby mode is highly desirable. Accordingly, some flexibility exists in adjusting (e.g., increasing or reducing) clocked standby mode pulses (e.g., in frequency, pulse width, etc.) by a certain factor. Alternatively, generation of the self-refresh pulses may be controlled by changing a constant current provided to the self-refresh oscillator within the self-refresh unit, or by altering capacitances of capacitors within that oscillator. For example, generation of the self-refresh pulses may be varied from a very high frequency to a very low frequency for cell charge retention tests. These techniques enable adjustment of the clocked standby period by specific factors (e.g., one-half, one, two, four, etc.).

The techniques described above suffer from several disadvantages. In particular, there is no manner providing full control of the clocked standby mode with respect to testing. Although the techniques enable variation of the period of the clocked standby mode by specific factors, there is no manner providing utilization of intermediate factor values or extending the clocked standby mode period for long durations (e.g., eternity). This latter capability is needed to ascertain the limits of each voltage generated by the generator system in the clocked standby mode (e.g., thereby optimizing stability and robustness with conservation of current).

In addition, there is no manner of linking or synchronizing an external command sequence or other interface (e.g., self-refresh entry and exit commands from an external test unit) with the internal self-refresh oscillator. In other words, the self-refresh oscillator operates independently or in an asynchronous manner with respect to the external command sequence or interface. This occurs even in the event of adjustment of the clocked standby mode period by the above-described techniques. The linking capability is needed to test various worst case conditions, such as when a self-refresh exit command is received just before the next clocked standby mode. In this worst case condition, the internal voltages for the memory are generated by the power or generator system in response to a standby mode pulse enabling the system for a portion of the self-refresh interval. However, the generated voltages decrease in potential during the standby mode when the generator system is idle. Thus, the internal voltages basically continually increase (e.g., generation by the power system during enablement) and decrease (e.g., standby or idle mode of the power system) during memory operation, thereby forming a ripple type pattern. The worst case condition of exiting a self-refresh mode just prior to a standby mode pulse represents the maximum reduction in potential of the internal voltages (e.g., after a standby mode and prior to power system enablement), where the voltages are typically furthest from corresponding target voltages. The linking capability is further needed to test other worst case conditions relating to certain interface specification parameters. For example, timings for various memory products (e.g., Pseudo-SRAM, Cellular RAM, etc.) are based on worst case conditions where an internal refresh event occurs at a certain time relative to external commands applied to the chip. Another example includes a timing specification for DRAMs with respect to an exit from self-refresh. Although tests may be conducted for several hours to ascertain values for each possible time difference between internally clocked standby mode pulses and externally generated self-refresh exit or other commands, these tests rely on chance to capture the worst case conditions where there is extremely low probability that the values for the worst case conditions (e.g., receiving a self-refresh exit command just before a clocked standby pulse, etc.) may be obtained in a reasonable time period.

SUMMARY OF THE INVENTION

Embodiments of the present invention include controlling generation of pulses for refresh operations of a memory device having a plurality of pads to transfer information. According to an embodiment of the present invention, an apparatus includes a current source to generate current, a switch coupled to the current source and at least one of the memory device pads, and an oscillator to generate the refresh operation pulses. At least one pad receives signals from an external interface to control generation of the refresh operation pulses. The switch is responsive to a control signal to provide signals from one of the current source and the at least one pad. The oscillator is coupled to the switch to receive signals from one of the current source and the at least one pad, and generates refresh operation pulses with characteristics in accordance with the signals received from the switch. The embodiments of the present invention further include a method and a memory device for controlling generation of refresh operation pulses as described above.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION OF THE PREFERRED EMBODIMENTS

Figure 1:
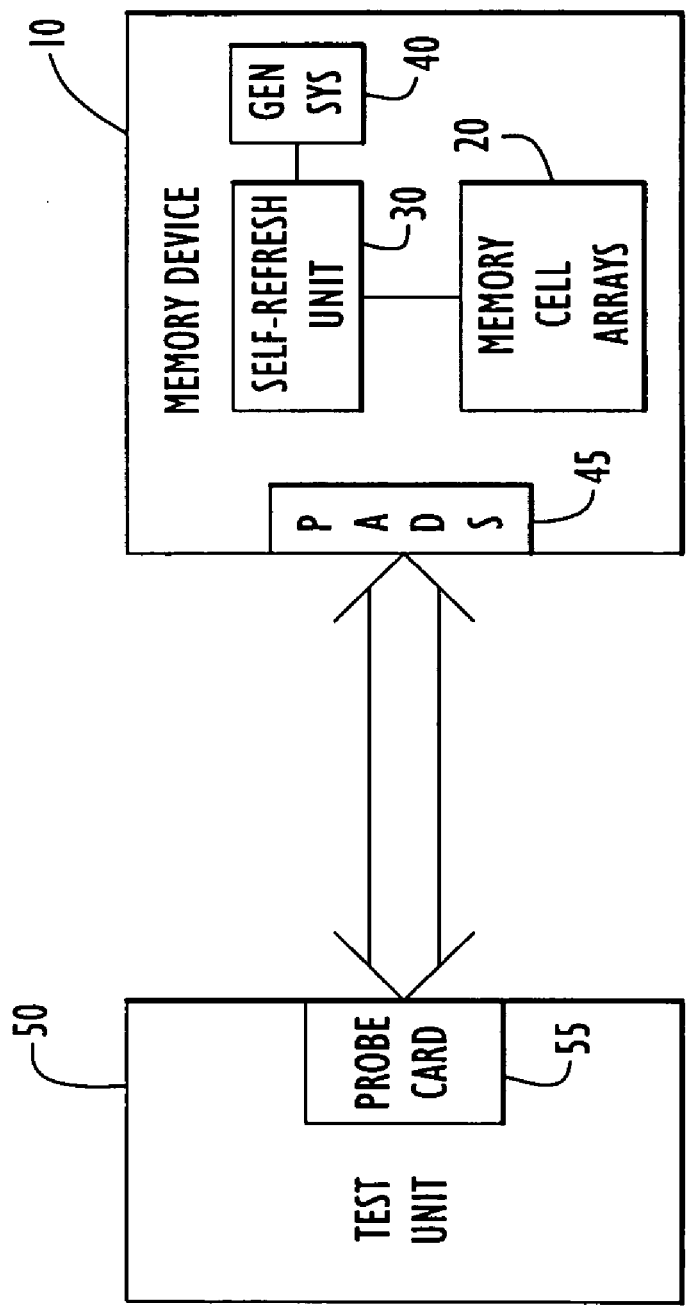
FIG. 1 is a block diagram of a memory device according to an embodiment of the present invention.

An embodiment of the present invention is illustrated in FIG. 1. Specifically, a memory device 10 is in the form of a chip or die and includes a plurality of memory cell arrays 20, a self-refresh unit 30 and a power or generator system 40. By way of example, memory device 10 is a dynamic random access memory (DRAM); however, the memory device may be of any type and include any desired storage capacity distributed in any fashion among the memory cell arrays. Each memory cell array 20 is configured in a matrix of intersecting rows and columns. The rows are commonly referred to as word lines. Each memory cell generally includes a storage capacitor to hold a charge and a transistor to access the charge of the capacitor. The charge may be a high or low voltage potential (referred to as a data bit), thereby providing the memory cell with two logic states.

The memory cells must be refreshed periodically due to leakages within the capacitors storing the charges (or bits). Accordingly, self-refresh unit 30 generates self-refresh pulses to enable each memory cell to be refreshed according to a desired specification as described below. Further, power or generator system 40 generates appropriate internal voltages for memory operation. For low power memory designs (e.g., CellularRAMs, MobileRAMs, etc.), a portion of the generator system is clocked to permit that system to be enabled a certain percentage (e.g., 10%, etc.) of the time during a self-refresh mode in order to conserve current. The clocked standby mode (e.g., mode or time interval in which the generator system is idle) for the generator system is controlled by control signals or pulses received from self-refresh unit 30 based on the generated self-refresh pulses. The memory cell arrays, and generator system may be implemented by any conventional or other components performing the functions described herein.

Memory device 10 may be coupled to a test unit 50 to perform various memory tests. The test unit may be implemented by any conventional or other test units and preferably includes a processor with software (e.g., programs, etc.) and/or hardware modules enabling the test unit to transfer appropriate signals with the memory device to conduct tests and evaluate corresponding test results. The memory device typically includes a series of pads or contacts 45, where the test unit preferably employs a probe card 55 to access the pads and enable information to be transferred between the memory device and test unit.

Generally, a self-refresh oscillator within a memory self-refresh unit operates with limited control and independently or in an asynchronous manner with respect to an external command sequence or interface as described above. However, according to an embodiment of the present invention, external control of a self-refresh oscillator within self-refresh unit 30 is provided to enable control of the oscillator to produce self-refresh pulses with any desired periods, even eternity. This enables control of the clocked standby mode period of power or generator system 40. In addition, since the period of the self-refresh oscillator may be controlled by the test unit, a command sequence executed by test unit 50 can be aligned with the self-refresh oscillator period, thereby enabling various worst case conditions (e.g., a self-refresh exit command issuing just before a next clocked standby mode pulse, where generated voltages are furthest from target voltages, etc.) to be reproduced and tested (e.g., self-refresh exit or other commands may be issued from the test unit in a determined relation to a clocked standby mode pulse). In this condition, the internal voltages for the memory are generated by the power or generator system in response to a standby mode pulse. However, the generated voltages decrease in potential during the standby mode when the generator system is idle. Thus, the internal voltages basically continually increase (e.g., generation by the power system during enablement) and decrease (e.g., standby or idle mode of the power system) during memory operation, thereby forming a ripple type pattern. The worst case condition of exiting a self-refresh mode just prior to a standby mode pulse represents the maximum reduction in potential of the internal voltages (e.g., after a standby mode and prior to power system enablement), where the voltages are supposedly furthest from corresponding target voltages. The capability to reproduce and test this and other worst case conditions enables robustness of the memory design.

In order to control the self-refresh oscillator, a constant current provided to the self-refresh oscillator is overwritten with signals from a test mode pad coupled to test unit 50. The test unit provides signals or pulses to the pad defining a self-refresh period, where the test unit may be configured to provide any desired period. The constant current is overwritten by the pulses on the pad, thereby controlling the self-refresh oscillator (and clocked standby mode) period and enabling a command sequence from the test unit to be aligned with that period. This enables a worst case condition (e.g., a self-refresh exit command issuing just before a next clocked standby mode pulse for memory power system 40, where generated voltages are furthest from target voltages) to be reproduced and tested (e.g., a self-refresh exit command may be issued from the test unit prior to a clocked standby mode pulse).

Figure 2:
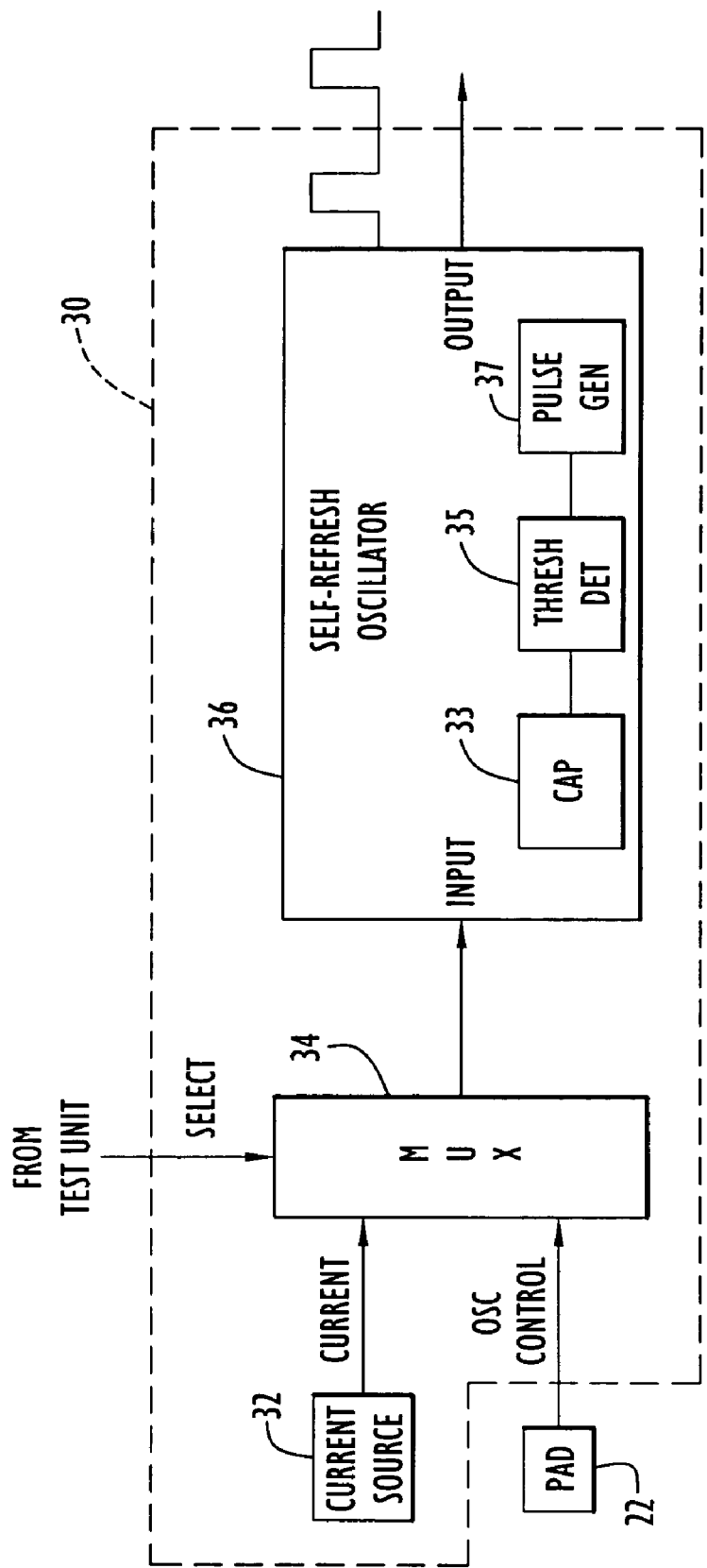
FIG. 2 is a schematic block diagram of an embodiment of a self-refresh unit of the memory device of FIG. 1.

An embodiment of self-refresh unit 30 is illustrated in FIG. 2. Specifically, self-refresh unit 30 includes a current source 32, a switch 34 and a self-refresh oscillator 36. Current source 32 generates a constant current source to enable oscillator 36 to generate self-refresh pulses. The current source may be implemented by any conventional or other current producing device.

Switch 34 is coupled to a test pad 22 of memory device 10, current source 32 and oscillator 36. The test pad is accessed by test unit 50 via probe card 55 (e.g., the test unit may assign one or more test channels to the pad) and receives signals indicating a desired self-refresh pulse period. The switch provides signals from either the test pad (e.g., OSC CONTROL as viewed in FIG. 2) or current source (e.g., CURRENT as viewed in FIG. 2) to the oscillator in accordance with a control signal (e.g., SELECT as viewed in FIG. 2) from the test unit. Preferably, test unit 50 initiates a test mode (e.g., via a set or other command) that utilizes corresponding register settings within the memory to perform tests and control switch 34 (e.g., provide the switch control signal). However, the control signal may be generated and/or supplied via any conventional or other techniques (e.g., the test unit may provide the signal directly or indirectly to the switch, etc.). By way of example only, the switch is configured to provide the signals from test pad 22 to oscillator 36 in response to the control signal attaining a high logic level. However, the switch may be configured to provide any desired signals to the oscillator in response to any values of the control signal (e.g., low or high logic level, any desired analog values, etc.). The switch is preferably implemented by a multiplexer, but may be implemented by any conventional or other switching device (e.g., gates, transistors, circuitry, processor, etc.).

Oscillator 36 generates self-refresh pulses in accordance with the signals (e.g., INPUT as viewed in FIG. 2) provided by switch 34 (e.g., current generated by current source 32 or signals received from test unit 50 via pad 22). Oscillator 36 includes a capacitor 33, a threshold detection unit 35 and a pulse generator 37. The oscillator and corresponding components may be implemented by any conventional or other devices to produce pulses or other signals at a desired frequency. Capacitor 33 is coupled to the signal (e.g., INPUT as viewed in FIG. 2) received by oscillator 36 and initiates charging. When the capacitor attains a certain voltage level as detected by threshold detection unit 35, pulse generator 37 produces a self-refresh output pulse (e.g., OUTPUT as viewed in FIG. 2), while capacitor 33 is discharged, preferably to a ground potential, in order to enable generation of subsequent pulses.

Figure 3:
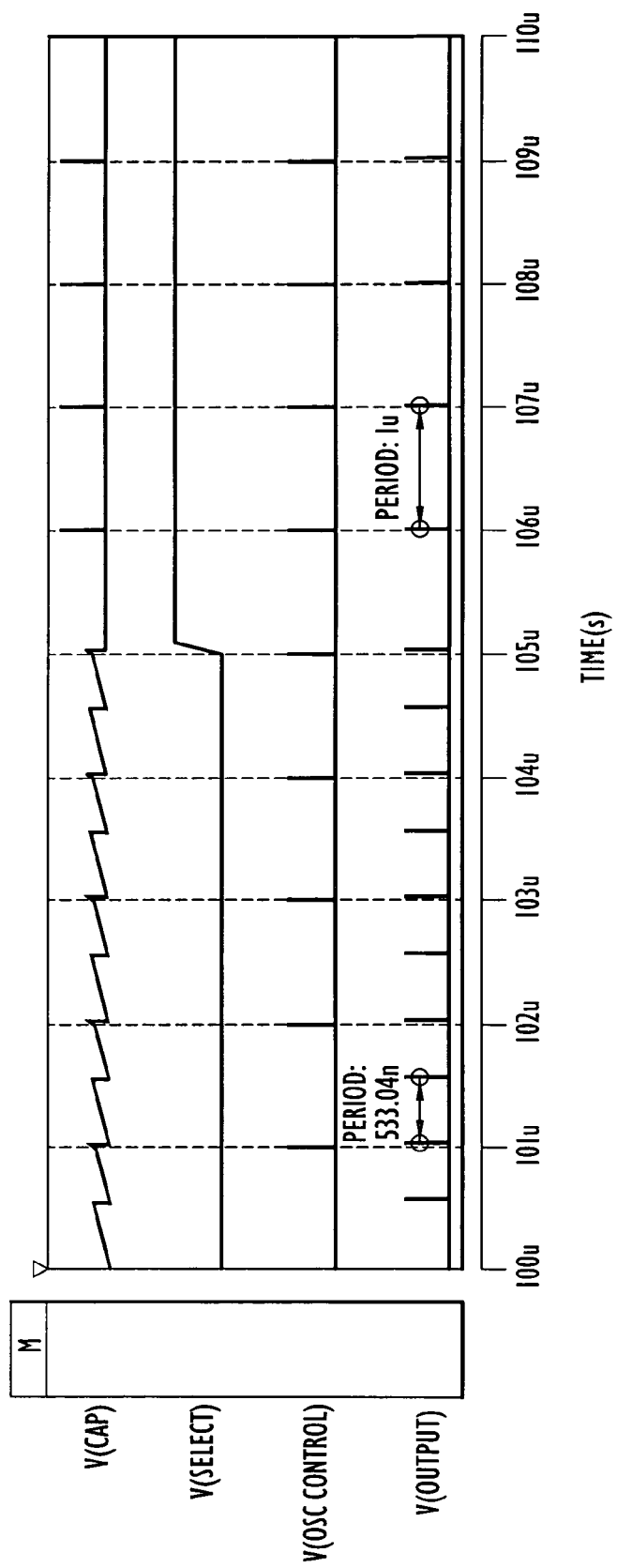
FIG. 3 is an exemplary timing diagram of the self-refresh unit of FIG. 2.

Operation of self-refresh unit 30 is described, by way of example only, with reference to FIGS. 2-3. FIG. 3 illustrates a graphical plot of voltage versus time or a timing diagram (e.g., V(CAP) represents the voltage of capacitor 33, V(SELECT) represents the control signal provided to switch 34, V(OSC CONTROL) represents the signals from test pad 22 provided by test unit 50 and V(OUTPUT) represents the output pulse from oscillator 36) for self-refresh unit 30.

Initially, the control signal (e.g., V(SELECT) as viewed in FIG. 3) is in a low state, thereby controlling switch 34 to provide the current from current source 32 to oscillator 36. The period on the graphical plot or timing diagram between 100 and 105 microseconds (FIG. 3) illustrates this scenario. The oscillator in this case exhibits a typical charging behavior (e.g., V(CAP), V(SELECT) and V(OUTPUT) as viewed in FIG. 3). In particular, capacitor 33 commences charging in response to the supplied current (e.g., indicated by the ramp of V(CAP) as viewed in FIG. 3). When the capacitor charges sufficiently to reach a threshold detection level as determined by threshold detection unit 35, a pulse is generated by pulse generator 37 and the capacitor is discharged (e.g., indicated by the oscillator output pulse V(OUTPUT) substantially aligned with the drop in the capacitor voltage V(CAP) as viewed in FIG. 3). In this case, the period of the output pulse (e.g., approximately 533.04 nanoseconds for V(OUTPUT) as viewed in FIG. 3) is defined by the current, the capacitance of capacitor 33 and the threshold detection level.

Once the control signal for switch 34 (e.g., V(SELECT) as viewed in FIG. 3) attains a high logic level (e.g., slightly beyond 105 microseconds as viewed in FIG. 3), the switch provides signals (e.g., V(OSC CONTROL) as viewed in FIG. 3) from test pad 22 (and hence test unit 50) to oscillator 36. By way of example only, the signals are in the form of a pulse train with a one microsecond period as viewed in FIG. 3. Capacitor 33 commences charging in response to the supplied signals (e.g., indicated by the pulses or spikes of V(CAP) as viewed in FIG. 3). The signals provided by the test unit or test pad preferably include a voltage level exceeding the threshold detection level in order to immediately trigger generation of a pulse. However, the signals may include any desired voltage level to trigger a pulse within any suitable period.

Since the signal supplied by the test unit or test pad exceeds the threshold detection level, capacitor 33 immediately attains the threshold detection level as determined by threshold detection unit 35 (e.g., indicated by the pulses or spikes of the capacitor, V(CAP), substantially coincident the pulses of the test pad, V(OSC CONTROL), as viewed in FIG. 3). Thus, the signals of the capacitor (e.g., V(CAP)) exhibit the same behavior as the signals from the test pad (e.g., V(OSC CONTROL)) since the current from the current source is effectively overwritten. Consequently, a pulse is generated by pulse generator 37 and the capacitor is discharged (e.g., indicated by the oscillator output pulse V(OUTPUT) substantially aligned with the pulses of the capacitor V(CAP) and test pad, V(OSC CONTROL), as viewed in FIG. 3). The oscillator follows the external pulses from test pad 22 or test unit 50, where the oscillator output pulses (e.g., V(OUTPUT)) include the same period (e.g., one microsecond as viewed in FIG. 3) as the external forced signals from the test pad or test unit (e.g., V(OSC CONTROL)). Accordingly, any desired external interfaces, patterns or command sequences can be aligned to the period (e.g., one microsecond) of the oscillator, where the oscillator may be controlled to provide any desired period.

It will be appreciated that the embodiments described above and illustrated in the drawings represent only a few of the many ways of implementing a method and apparatus for external control of a self-refresh oscillator within a memory device.

The present invention may be employed with any type of memory device (e.g., RAM, DRAM, ROM, DDR, dynamic, static, etc.) including any quantity of any types of memory cell arrays with any desired storage capacities (e.g., kilobits, megabits, gigabits, etc.). The memory cell arrays may include any types of memory cells (e.g., transistors, capacitors, etc.). The chip or die may be arranged in any fashion and may be of any shape or size. The components (e.g., self-refresh unit, pads, generator system, memory cell arrays, etc.) may be arranged on the chip in any desired fashion and may be implemented by any conventional or other components (e.g., circuitry, chips, gates, logic, etc.) performing the functions described herein. The memory device may receive commands from any quantity of any type of external devices (e.g., processor, controller, etc.).

The test unit may be implemented by any quantity of any conventional or other test unit and may include any combination of software (e.g., programs, etc.) and/or hardware modules (e.g., processor, circuitry, etc.). The probe card may be implemented by any quantity of any conventional or other probe devices and include any quantity of contacts to couple with device pads. The power or generator system may be implemented by any quantity of any conventional or other device (e.g., power supply, etc.) generating appropriate internal or other voltages for memory device operation. The generated voltages may be of any desired potential or type (e.g., analog, digital, DC, AC, etc.). The power or generator system may be enabled for any desired portion of a refresh or other interval (e.g., 10%, 20%, etc.).

The current source may be implemented by any quantity of any conventional or other device producing a substantially constant current (e.g., current source, etc.). The switch may include any quantity of any conventional or other switching devices, where the switching devices may be implemented by any conventional or other devices (e.g., multiplexers, switches, gate array, logic, processor, etc.) to couple any quantity of signals or selections to the oscillator. The switching device may couple any quantity of signals to any quantity of oscillators based on any desired inputs or conditions (e.g., control signals, etc.). The switch control signals may be of any types or values (e.g., logic high, logic low, digital, analog, etc.) to provide signals to the oscillator. The pads (e.g., memory device, pad receiving pulse period signals, etc.) may be of any quantity, may be arranged and disposed on the chip in any fashion (e.g., in any area) and may be implemented by any conventional or other pads (e.g., contacts, terminals, etc.). The pads may be utilized to transfer any desired information (e.g., data, commands, addresses, oscillator or other control signals, pulses, etc.). The signal from the test unit for the oscillator period may be in any desired form (e.g., pulses, etc.) and include any desired characteristics (e.g., frequency/period, pulse width, voltage level, etc.). The test unit may provide the pulse train to control the oscillator, or the memory unit may generate the desired pulse train to control the oscillator based on information from the test unit. The oscillator may be controlled to provide a pulse with any desired characteristics (e.g., frequency/period, pulse width, voltage level, etc.).

The oscillator may be implemented by any quantity of any conventional or other oscillator or pulse generating device (e.g., voltage controlled (VCO) or numerically (NCO) oscillator, etc.). The oscillator may include any quantity of any conventional or other capacitors or charging devices, where the capacitors may include any suitable capacitances and/or be arranged in any fashion to produce a desired overall capacitance (e.g., in series, parallel, etc.). The threshold detection unit may be implemented by any quantity of any conventional or other detection devices (e.g. processors, circuitry, logic, etc.) to compare a voltage with a threshold. The detection unit may compare the voltage to a threshold in any manner (e.g., greater than, less than, equal to, greater than or equal to, less than or equal to, etc.) to trigger generation of a pulse. The threshold may be any suitable value to produce pulses with desired characteristics (e.g., frequency/period, pulse width, voltage level, etc.). The pulse generator may be implemented by any quantity of any conventional or other pulse generation devices (e.g. processors, circuitry, logic, etc.) to produce desired pulses.

The present invention is not limited to the applications or specific timing diagram described above, but may be applied to any types of memory or other devices where external control of an oscillator is desirable. Further, the periods illustrated in the timing diagram (e.g., period of operation, period of output and/or other pulses, etc.) are exemplary, where the operation of the present invention may include any desired periods. Moreover, the present invention may enable synchronization of the oscillator with any external interface (e.g., test unit, command sequence, etc.).

It is to be understood that the terms "top", "bottom", "front", "rear", "side", "height", "length", "width", "upper", "lower" and the like are used herein merely to describe points of reference and do not limit the present invention to any particular orientation or configuration. Further, the names or labels for the various signals used herein are merely exemplary and utilized for identification to reference signals of the present invention. These signals may be utilized or associated with any names or labels.

From the foregoing description, it will be appreciated that the invention makes available a method and apparatus for external control of a self-refresh oscillator within a memory device, wherein a self-refresh oscillator within a memory device is controlled during a test mode to enable measurement of various memory operating characteristics.

Having described preferred embodiments of a new and improved method and apparatus for external control of a self-refresh oscillator within a memory device, it is believed that other modifications, variations and changes will be suggested to those skilled in the art in view of the teachings set forth herein. It is therefore to be understood that all such variations, modifications and changes are believed to fall within the scope of the present invention as defined by the appended claims.

What is claimed is:

1. A memory device comprising:
a plurality of memory cell arrays;
at least one pad to receive an external control signal; and
a self-refresh unit to control refresh operations for said memory cell arrays, wherein said self-refresh unit includes:
a current source to generate current;
a switch, coupled to said current source and to said at least one pad, and responsive to a control signal to output one of the current from said current source and the external control signal from said at least one pad; and
an oscillator, coupled to said switch, to generate refresh operation pulses in response to said signals received from said switch.

2. The memory device of claim 1, wherein said switch includes a multiplexer.

3. The memory device of claim 1, wherein said memory device includes a dynamic random access memory.

4. A memory device comprising:
a plurality of memory cell arrays;
at least one pad to receive an external control signal; and
a self-refresh unit to control refresh operations for said memory cell arrays, wherein said self-refresh unit includes:
a current source to generate current;
a switch, coupled to said current source and to said at least one pad, and responsive to a control signal to output signals from one of said current source and said at least one pad; and
an oscillator, coupled to said switch, to generates refresh operation pulses in a synchronous manner with respect to an external interface in response to receiving signals from said external interface via said switch.

5. The memory device of claim 4, wherein said switch includes a multiplexer.

6. The memory device of claim 4, wherein said memory device includes a dynamic random access memory.

7. A memory device comprising:
a plurality of memory cell arrays;
at least one pad to receive an external control signal; and
a self-refresh unit to control refresh operations for said memory cell arrays, wherein said self-refresh unit includes:
a current source to generate current;

a switch, coupled to said current source and to said at least one pad, and responsive to a control signal to output signals from one of said current source and said at least one pad; and an oscillator, coupled to said switch, to generate refresh operation pulses in response to said signals received from said switch;

wherein an external interface includes a test unit and said at least one pad receives a desired waveform for said refresh operation pulses from said test unit, and wherein said oscillator generates said refresh operation pulses in accordance with said desired waveform in response to receiving said signals from said at least one pad via said switch.

8. The memory device of claim 7, wherein said switch includes a multiplexer.

9. The memory device of claim 7, wherein said memory device includes a dynamic random access memory.

* * * * *